United States Patent
Murata

(10) Patent No.: US 10,861,510 B2
(45) Date of Patent: Dec. 8, 2020

(54) MAJORITY VOTING PROCESSING DEVICE, SEMICONDUCTOR MEMORY DEVICE, AND MAJORITY VOTING METHOD FOR INFORMATION DATA

(71) Applicant: LAPIS Semiconductor Co., Ltd., Yokohama (JP)

(72) Inventor: Nobukazu Murata, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/417,019

(22) Filed: May 20, 2019

(65) Prior Publication Data

US 2019/0371375 A1 Dec. 5, 2019

(30) Foreign Application Priority Data

May 29, 2018 (JP) ................................. 2018-101998

(51) Int. Cl.
*G11C 7/10* (2006.01)
*H03K 19/23* (2006.01)
*G06F 3/06* (2006.01)

(52) U.S. Cl.
CPC .......... *G11C 7/1087* (2013.01); *G06F 3/0604* (2013.01); *G06F 3/0659* (2013.01); *G06F 3/0673* (2013.01); *G11C 7/1069* (2013.01); *G11C 7/1096* (2013.01); *H03K 19/23* (2013.01)

(58) Field of Classification Search
CPC ... G11C 7/1087; G11C 7/1096; G11C 7/1069; G11C 7/1006; G06F 3/0673; G06F 3/0604; G06F 3/0659
See application file for complete search history.

(56) References Cited

U.S. PATENT DOCUMENTS

| 2007/0133291 A1* | 6/2007 | Fukuda | G11C 16/0483 365/185.17 |
| 2018/0205396 A1* | 7/2018 | Ikegawa | G06F 11/1068 |
| 2020/0059252 A1* | 2/2020 | Fackenthal | G06F 11/1076 |

FOREIGN PATENT DOCUMENTS

JP H0357048 A 3/1991

* cited by examiner

*Primary Examiner* — Mohammed A Bashar
(74) *Attorney, Agent, or Firm* — Rabin & Berdo, P.C.

(57) ABSTRACT

A majority voting processing device performs majority voting on respective bits of information data piece including r-number of bits (r is an integer of 2 or greater). The device includes a memory including a plurality of memory element groups each including r-number of memory elements that store data for the corresponding r-number of bits, respectively, the plurality of memory element groups each being provide for one address. A memory access unit writes each bit of the information data piece in k-number (k is an odd number of 3 or greater) of the memory elements in the memory element group corresponding to one address, and reads out the k-number of bits written in the k-number of the memory elements corresponding to that one address. A majority voter that performs majority voting on the k-number of bits read out from the memory by the memory access unit.

5 Claims, 6 Drawing Sheets

MAJORITY VOTING PROCESSING DEVICE, SEMICONDUCTOR MEMORY DEVICE, AND MAJORITY VOTING METHOD FOR INFORMATION DATA

BACKGROUND OF THE INVENTION

Technical Field

Embodiments described herein relate to a majority voting processing device that obtains information data with the highest probability by majority voting, a semiconductor memory device including the majority voting processing device, and a majority voting method for information data.

Background Art

A semiconductor memory in which the reliability of written information data is enhanced by majority voting is known (see Japanese Patent Application Laid-open Publication No. H3-57048 (Patent Document 1), for example).

The semiconductor memory of Patent Document 1 is configured to receive an information data piece to be written therein and to write the same information data piece as that information data piece into three memory cell arrays, each of which has independent 8-bit input/output ports. When the data is to be read out, the semiconductor memory selects one information data piece from the three information data pieces each having 8 bits through majority voting, and outputs the information data piece as output data.

SUMMARY OF THE INVENTION

The semiconductor memory of Patent Document 1 requires three memory cell arrays each having independent input/output ports, which causes a problem of increasing the circuit size of the overall device.

If majority voting is to be conducted on the read-out information data pieces using one memory cell array only, one information data piece needs to be written in three addresses, for example, and in a reading process, the information data is read out from those three addresses consecutively, and those three information data pieces are subjected to majority voting.

Thus, in order to perform majority voting with one memory cell array only, three data latches are required in a stage preceding to the majority voting circuit so that those three information data pieces are held until all three information data pieces are read out from the one memory cell array. The circuit size of each of the data latches increases as the bit number of the information data piece increases, and therefore, the size of the entire device would increase.

An object is to provide a majority voting processing device that can perform majority voting on information data pieces without increasing the device size, a semiconductor memory device, and a majority voting method for information data.

A majority voting processing device of one or more embodiments is a majority voting processing device performing majority voting on respective bits of information data piece including r-number of bits (r is an integer of 2 or greater), including: a memory including a plurality of memory element groups each including r-number of memory elements that store data for the corresponding r-number of bits, respectively, the plurality of memory element groups each being provide for one address; a memory access unit writes each bit of the information data piece in k-number (k is an odd number of 3 or greater) of the memory elements in the memory element group corresponding to one address, and reads out the k-number of bits written in the k-number of the memory elements corresponding to that one address; and a majority voter that performs majority voting on the k-number of bits read out from the memory by the memory access unit.

A semiconductor memory device of one or more embodiments is a semiconductor storage device having a memory cell array including a plurality of memory element groups each including r-number (r is an integer of 2 or greater) of memory cells that store data for respective r-number of bits, the plurality of memory element groups each being provided for one address, the semiconductor storage device, comprising: a memory access unit writes each bit of the information data piece in k-number (k is an odd number of 3 or greater) of the memory cells in the memory element group corresponding to one address, and reads out the k-number of bits written in the k-number of the memory cells corresponding to that one address; and a majority voter that performs majority voting on the k-number of bits read out from the memory cell array by the memory access unit.

A majority voting method of one or more embodiments is a majority voting method of information data in which an information data piece of r-number of bits (r is an integer of 2 or greater) is written in k-number of places (k is an odd number of 3 or greater) in a memory that includes a plurality of memory element groups each including r-number of memory elements that store data for the respective r-number of bits, the plurality of memory element groups each being provided for one address, and majority voting is performed on respective bits of the same bit digit of the k-number of information data pieces read out from the k-number of places for each bit digit, the method including: writing, for each bit of the information data piece, that one bit into k-number of memory elements corresponding to one address; and reading out the k-number of bits written in the k-number of memory elements corresponding to one address at the same time, and performing majority voting on those k-number of bits that are read out.

In an embodiment, the following processes are performed to write an information data piece of r bits in k-number of places in a memory that includes a plurality of memory element groups each including r-number of memory elements that store data for the respective r bits, the memory element group functioning as a unit of an address, and to perform majority voting on the information data piece read out from the k-number of places for each bit.

First, for every bit of the information data piece, that one bit is written into k-number of memory elements corresponding to one address. Thereafter, the k-number of bits written in the k-number of memory elements corresponding to one address are read out, and majority voting is performed on those k-number of bits that are read out.

This way, the respective bits of k-number of read-out data pieces that are subjected to majority voting are read out at the same time for the same bit digit by one read-out access to the single memory, and therefore, majority voting can be performed directly on those k-number of bits that are read out.

As a result, according to one embodiment, data latches in a stage preceding to the majority voter circuit can be eliminated, which makes it possible to perform majority voting on the information data pieces without increasing the device size.

DETAILED DESCRIPTION OF THE INVENTION

Embodiment 1

Figure 1:
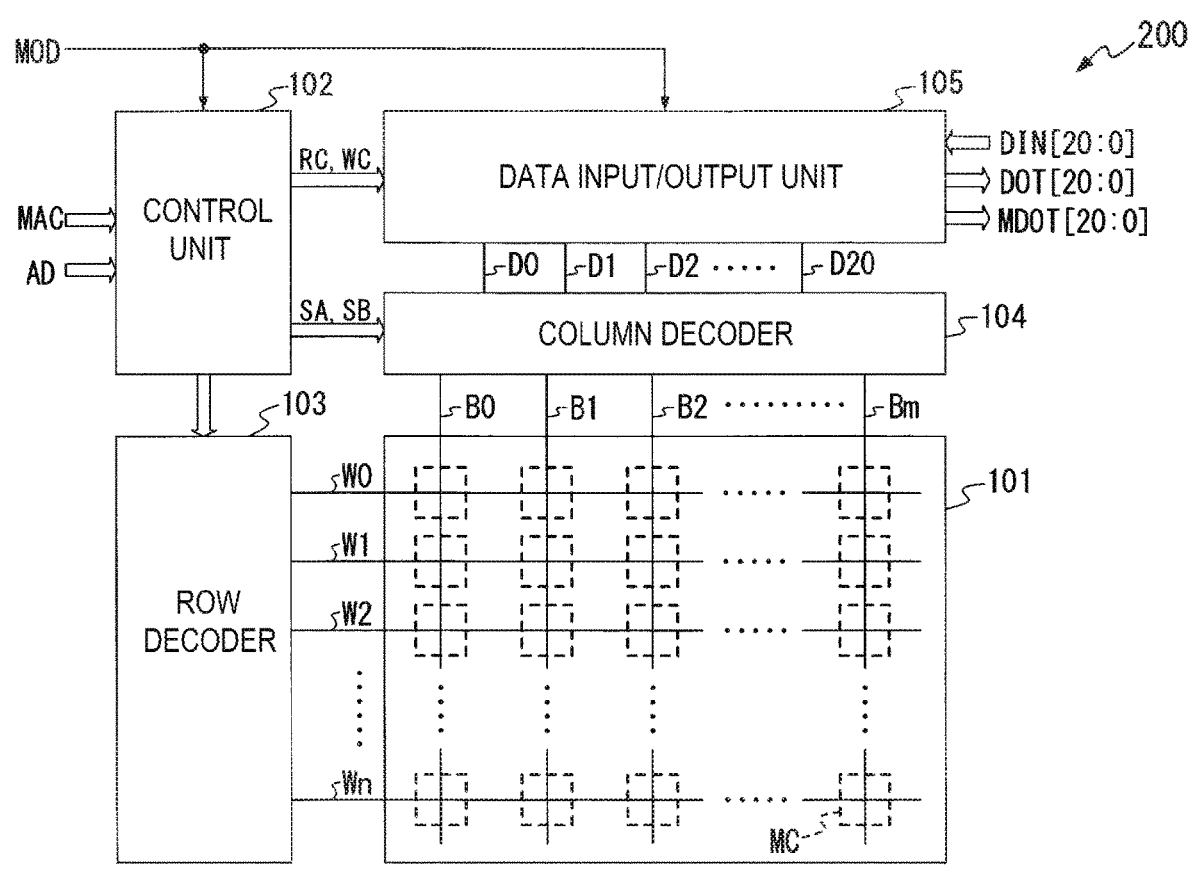
FIG. 1 is a block diagram showing a schematic configuration of a semiconductor memory device 200.

FIG. 1 is a block diagram showing a schematic configuration of a semiconductor memory device 200, which functions as the majority voting processing device of an embodiment. In the present specification and claims, the term "majority voting" refers to a logic circuit in which multiple inputs are received and one output is generated based on the value of the majority of inputs. In embodiments, the multiple inputs may refer to data bits that all correspond to a same address and the majority voting calculation may determine the value to be output when the address is accessed.

The semiconductor memory device 200 includes a memory cell array 101, a control unit 102, a row decoder 103, a column decoder 104, and a data input/output unit 105.

The memory cell array 101 includes bit lines B0 to Bm (m is an integer of 2 or greater) and word lines W0 to Wn (n is an integer of 2 or greater) arranged to intersect with the bit lines B0 to Bm. Furthermore, at each of the intersections of the bit lines B and the word lines W, a memory cell MC connected to one bit line B and one word line W is disposed. In one embodiment, a memory cell MC includes one or more transistors. However, embodiments are not limited only to semiconductor-type transistors, but include any memory device capable of storing a bit of data with a row decoder and column decoder.

Each memory cell MC receives a selection voltage applied via a word line W connected to the memory cell MC and a write-in voltage applied via a bit line B connected to the memory cell MC, and writes a data bit therein in accordance with the selection voltage and the write-in voltage. Also, each memory cell MC applies, to a bit line B connected to the memory cell MC, a current corresponding to the data bit written therein in accordance with the selection voltage applied via a word line W connected to the memory cell MC and the read-out voltage applied via the corresponding bit line B.

The control unit 102 receives a memory access signal MAC indicating a write-in command, read-out command, and the like, and an address AD from outside the semiconductor memory device 200. In addition, the control unit 102 receives an operation mode signal MOD indicating one of the majority voting mode and the normal mode from outside the semiconductor memory device 200.

The control unit 102 generates a word line selection signal for selecting one of the word lines W0 to Wn based on the address AD, and supplies this signal to the row decoder 103.

When the memory access signal MAC indicates a read-out command, the control unit 102 supplies a read-out command signal RC to the data input/output unit 105, and when the memory access signal MAC indicates a write-in signal, the control unit 102 supplies a write-in command signal WC to the data input/output unit 105.

Furthermore, the control unit 102 generates an address SA specifying a plurality of bit lines to be subjected to the write-in access and an address SB specifying a plurality of bit lines B to be subjected to the read-out access, among the bit lines B0 to Bm, and supplies those addresses to the column decoder 104.

When the operation mode signal MOD indicates the majority voting mode, the control unit 102 generates the address SA and address SB that gradually change over time in one write-in access or read-out access.

The row decoder 103 applies a selection voltage to one word line W among the word lines W0 to Wn in the memory cell array 101, based on the word line selection signal supplied by the control unit 102.

The column decoder 104 selects a plurality of bit lines B specified by the address SA and address SB among the bit lines B0 to Bm as a bit line group to be accessed. The number of the plurality of bit lines B selected as the bit line group to be accessed is the same as the number of the data bit lines D0 to D20 connected to the data input/output unit 105, or in other words, 21 lines. The column decoder 104 connects 21 bit lines B, which are to be accessed among the bit lines B0 to Bm, to the data bit lines D0 to D20, respectively.

The data input/output unit 105 receives the operation mode signal MOD and the information data DIN [20:0] made up of the 0-th bit to 20-th bit from outside the semiconductor memory device 200 as well as the read-out command signal RC and write-in command signal WC from the control unit 102. In embodiments, the operation mode signal MOD and the information data DIN [20:0] may be received from a controller, such as a processor chip running instructions to control data input/output operations. The controller may be located in a same device as the semiconductor memory device 200 or may be received from another computer connected to the semiconductor memory device 200.

If the data input/output unit 105 receives the write-in command signal WC when the operation mode signal MOD indicates the normal mode, the data input/output unit 105 generates write-in voltages each having a voltage value corresponding to the logic level of each bit of the information data DIN. That is, the data input/output unit 105 generates the 0-th to 20-th write-in voltages respectively corresponding to the 0-th to 20-th bits of the information data DIN. The data input/output unit 105 applies the generated 0-th to 20-th write-in voltages to the data bit lines D0 to D20, respectively. As a result, the 0-th to 20-th write-in voltages are applied to the 21 bit lines B selected as the access target among the bit lines B0 to Bm in the memory cell array 101, through the data bit lines D0 to D20, respectively.

If the data input/output unit 105 receives the read-out command signal RC when the operation mode signal MOD indicates the normal mode, the data input/output unit 105 first applies a read-out voltage to the 21 bit lines B selected as the read-out access target among the bit lines B0 to Bm, through the data bit lines D0 to D20. The data input/output unit 105 individually detects the current flowing through each bit line B or the voltage of each bit line B through the data bit lines D0 to D20. The data input/output unit 105 determines whether the logic level of each of the 0-th to 20-th bits, which is the read-out data of each bit, is 1 or 0, based on the detected current or voltage. Thereafter, the data input/output unit 105 outputs the read-out data DOT [20:0] made up of the 0-th to 20-th bits each having the logic level indicated by the determination results described above.

If the data input/output unit 105 receives the write-in command signal WC when the operation mode signal MOD indicates the majority voting mode, the data input/output unit 105 generates write-in voltages each having a voltage value corresponding to the logic level of each bit of the information data DIN. That is, the data input/output unit 105 generates the 0-th to 20-th write-in voltages respectively corresponding to the 0-th to 20-th bits of the information data DIN. The data input/output unit 105 divides the 0-th to 20-th write-in voltages into write-in voltage groups each made of three write-in voltages, and selects one write-in voltage from each of the write-in voltage groups. The data input/output unit 105 applies the write-in voltage selected from each write-in voltage group to three data bit lines D among the data bit lines D0 to D20 at the same time.

If the data input/output unit 105 receives the read-out command signal when the operation mode signal MOD indicates the majority voting mode, the data input/output unit 105 conducts the read-out process described below.

That is, the data input/output unit 105 first applies a read-out voltage to the 21 bit lines B selected as the read-out access target among the bit lines B0 to Bm, through the data bit lines D0 to D20. The data input/output unit 105 individually detects the current flowing through each bit line B or the voltage of each bit line B through the data bit lines D0 to D20. The data input/output unit 105 determines whether the logic level of each of the 0-th to 20-th bits, which is the read-out data of each bit, is 1 or 0, based on the detected current or voltage. Next, the data input/output unit 105 performs majority voting on three bits, which is the read-out data each read out by the three data bit lines D, and obtains the result as the read-out data for one bit. The data input/output unit 105 conducts the read-out process every time a plurality of bit lines B as the target of the read-out access change. Through this process, the data input/output unit 105 outputs the read-out data MDOT[20:0] made up of the 0-th to 20-th bits that were obtained by the majority voting performed for each bit.

Figure 2:
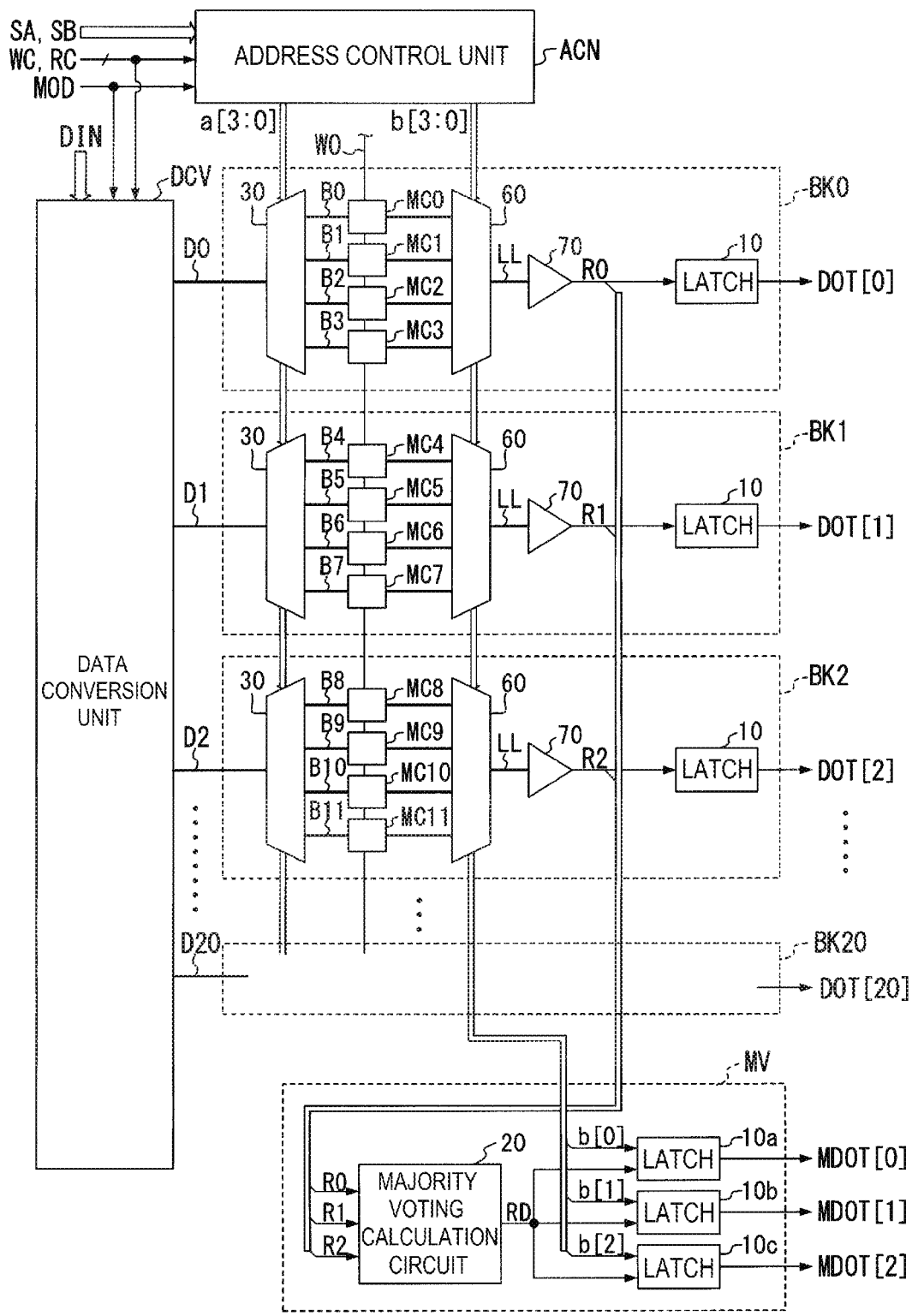
FIG. 2 is a block diagram showing an example of the internal configuration of a column decoder 104 and a data input/output unit 105.

FIG. 2 is a block diagram showing an example of the internal configuration of the column decoder 104 and the data input/output unit 105 to perform the majority voting described above.

The column decoder 104 and the data input/output unit 105 have a data conversion unit DCV, an address control unit ACN, and memory access blocks BK0 to BK20 each corresponding to the data bit lines D0 to D20.

FIG. 2 illustrates the internal configuration of the memory access blocks BK0 to BK2 corresponding to the data bit lines D0 to D2, respectively, among the memory access blocks BK0 to BK20. In the actual configuration, one majority voter MV is provided for three memory access block BK, but in FIG. 2, only one majority voter MV for the memory access blocks BK0 to BK2 is shown. That is, in the column decoder 104 and the data input/output unit 105, seven majority voters MV, one of which is shown in FIG. 2, are provided for the 21 memory access blocks BK.

As shown in FIG. 2, each memory access block BK has the same internal configuration, or in other words, includes a latch 10, selectors 30 and 60, and a sense amplifier 70, and the only difference is the data bit line D and the bit line B connected thereto. In FIG. 2, each memory access block BK includes a group of memory cells MC and a group of bit lines B connected to one word line W0 in the memory cell array 101, in order to illustrate the connection configuration between each memory access block BK and the bit lines B.

In the example of FIG. 2, 84 memory cells MC0 to MC83 are connected to one word line W0. The memory cells MC0, MC4, MC8, . . . , MC80 of the memory cells MC0 to MC83 are a group of memory elements corresponding to address [0000] indicated by the address AD, for example. The memory cells MC1, MC5, MC9, . . . , MC81 of the memory cells MC0 to MC83 are a group of memory elements corresponding to the address [0001] indicated by the address AD, for example. The memory cells MC2, MC6, MC10, . . . , MC82 of the memory cells MC0 to MC83 are a group of memory elements corresponding to address [0002] indicated by the address AD, for example. The memory cells MC3, MC7, MC11, . . . , MC83 of the memory cells MC0 to MC83 are a group of memory elements corresponding to address [0003] indicated by the address AD, for example.

Below, the operation of the latch 10, the selectors 30 and 60, and the sense amplifier 70 of each of the memory access blocks BK0 to BK2 will be explained.

The selector 30 of BK0 selects one bit line from the bit lines B0 to B3 of the memory cell array 101 based on the bit line select signal a[3:0] supplied from the address control unit ACN, and electrically connects the selected bit line to the data bit line D0. The selector 60 of BK0 selects one bit line from the bit lines B0 to B3 based on the bit line select signal b[3:0] supplied from the address control unit ACN, and electrically connects the selected bit line to the data bit line LL. The sense amplifier 70 of BK0 detects a current flowing through the data bit line LL or a voltage of the data bit line LL, and identifies whether the logic level of the data bit read out through the data bit line LL is 0 or 1, based on the detected current value or voltage value. The sense amplifier 70 supplies data bit R0, which is a data bit having the identified logic level, to the latch 10 and the majority voter MV. The latch 10 of BK0 holds and outputs the data bit R0 as a read-out data DOT[0] for the 0-th bit of the read-out data.

The selector 30 of BK1 selects one bit line from the bit lines B4 to B7 of the memory cell array 101 based on the bit line select signal a[3:0], and electrically connects the selected bit line to the data bit line D1. The selector 60 of BK1 selects one bit line from the bit lines B4 to B7 based on the bit line select signal b[3:0], and electrically connects the selected bit line to the data bit line LL. The sense amplifier 70 of BK1 detects a current flowing through the data bit line LL or a voltage of the data bit line LL, and determines whether the logic level of the data bit read out through the data bit line LL is 0 or 1, based on the detected current value or voltage value. The sense amplifier 70 supplies data bit R1, which is a data bit having the identified logic level, to the latch 10 and the majority voter MV. The latch 10 of BK1 holds and outputs the data bit R1 as a read-out data DOT[1] for the first bit of the read-out data.

The selector 30 of BK2 selects one bit line from the bit lines B8 to B11 of the memory cell array 101 based on the bit line select signal a[3:0], and electrically connects the selected bit line to the data bit line D2. The selector 60 of BK2 selects one bit line from the bit lines B8 to B11 based on the bit line select signal b[3:0], and electrically connects the selected bit line to the data bit line LL. The sense amplifier 70 of BK2 detects a current flowing through the data bit line LL or a voltage of the data bit line LL, and determines whether the logic level of the data bit read out through the data bit line LL is 0 or 1, based on the detected current value or voltage value. The sense amplifier 70 supplies data bit R2, which is a data bit having the identified logic level, to the latch 10 and the majority voter MV. The latch 10 of BK2 holds and outputs the data bit R2 as a read-out data DOT[2] for the second bit of the read-out data.

The majority voter MV includes a majority voting calculation circuit 20 and latches 10a to 10c each with an enable terminal. The majority voting calculation circuit 20 performs majority voting on the data bits R0 to R2, and generates a data bit RD having the logic level obtained as the result of the majority voting. The majority voting calculation circuit 20 supplies the data bit RD to the latches 10a to 10c. In embodiments, the majority voting calculation circuit 20 may be a logic circuit receiving as inputs the data bits R0 to R2, and, based on the value of the inputs R0 to R2, generating the output data bit RD according to the value of the majority of the inputs R0 to R2. While FIG. 2 describes data bits R0 to R2, embodiments are not limited to only three data bits representing data read out from memory cells. Instead, embodiments encompass any odd number of data bits representing data read out from an odd number of memory cells.

The latch 10a takes in the data bit RD when the bit line selection signal b[0] that corresponds to the address [0000], among the bit line selection signal b[3:0], has the logic level of 1, for example, and maintains the logic level of the data bit RD as long as the logic level of the bit line selection signal b[0] is 0. The latch 10a outputs a data bit having the maintained logic level as read-out data MDOT[0] representing the 0-th bit of the read-out data.

The latch 10b takes in the data bit RD when the bit line selection signal b[1] that corresponds to the address [0001], among the bit line selection signal b[3:0], has the logic level of 1, for example, and maintains the logic level of the data bit RD as long as the logic level of the bit line selection signal b[1] is 0. The latch 10b outputs a data bit having the maintained logic level as read-out data MDOT[1] representing the first bit of the read-out data.

The latch 10c takes in the data bit RD when the bit line selection signal b[2] that corresponds to the address [0002], among the bit line selection signal b[3:0], has the logic level of 1, for example, and maintains the logic level of the data bit RD as long as the logic level of the bit line selection signal b[2] is 0. The latch 10c outputs a data bit having the maintained logic level as read-out data MDOT[2] representing the second bit of the read-out data.

The data conversion unit DCV receives the operation mode signal MOD, the write-in command signal WC, the read-out command signal RC, and the information data DIN constituted of the 0th to 20th bits. The data conversion unit DCV converts the respective bits of the information data DIN to write-in voltages each having a voltage value corresponding to the logic level of the bit in accordance with the write-in command signal WC, thereby obtaining the 0th to 20th write-in voltages.

When the operation mode signal MOD indicates the normal mode, the data conversion unit DCV applies the generated 0th to 20th write-in voltages to the data bit lines D0 to D20.

On the other hand, when the operation mode signal MOD indicates the majority voting mode, the data conversion unit DCV first divides the 0th to 20th write-in voltages into write-in voltage groups each made of three write-in voltages, and selects one write-in voltage from each of the write-in voltage groups sequentially. Then, the data input/output unit 105 applies the write-in voltage selected for each write-in voltage group as described above to three data bit lines D among the data bit lines D0 to D20 at the same time.

The address control unit ACN receives the read-out command signal RC, the write-in command signal QC, the operation mode signal MOD, and addresses SA and SB.

When the operation mode signal MOD indicates the normal mode, the address control unit ACN generates the bit line selection signal a[3:0] in which the logic level of one signal indicated by the address SA is set to 1, and the logic level of the other signals is set to 0. The address control unit ACN also generates the bit line selection signal b[3:0] in which the logic level of one signal indicated by the address SB is set to 1, and the logic level of the other signals is set to 0. When the address control unit ACN receives the write-in command signal WC, the address control unit ACN supplies the bit line selection signal a[3:0] to the selector 30 of each memory access block BK. When the address control unit ACN receives the read-out command signal RC, the address control unit ACN supplies the bit line selection signal b[3:0] to the selector 60 of each memory access block BK.

On the other hand, if the operation mode signal MOD indicates the majority voting mode, the address control unit ACN conducts the following processes.

That is, when the address control unit ACN receives the write-in command signal WC, the address control ACN generates the bit line selection signal a[3:0] in which one of the bit line selection signals a[0], a[1], a[2], and a[3] is set to the logic level 1 in this order. When the address control unit ACN receives the write-in command signal WC, the address control unit ACN supplies the bit line selection signal a[3:0] to the selector 30 of each memory access block BK. When the address control unit ACN receives the read-out command signal RC, the address control ACN generates the bit line selection signal b[3:0] in which one of the bit line selection signal b[0], b[1], b[2], and b[3] is set to the logic level in this order. The address control unit ACN supplies the bit line selection signal b[3:0] to the selector 60 of each memory access block BK, and supplies the bit line selection signal b[2:0] to the majority voter MV.

Below, the memory access (writing and reading) operation by the memory access blocks BK0 to BK2 and the majority voter MV illustrated in FIG. 2 will be explained by using the 0th to second bits out of the 0th to 21st bits of the information data DIN to be written as an example. In the descriptions below, the 0th bit of the information data DIN is indicated as bit d0, the first bit is d1, and the second bit is bit d2.

[Normal Mode]

Figure 3:
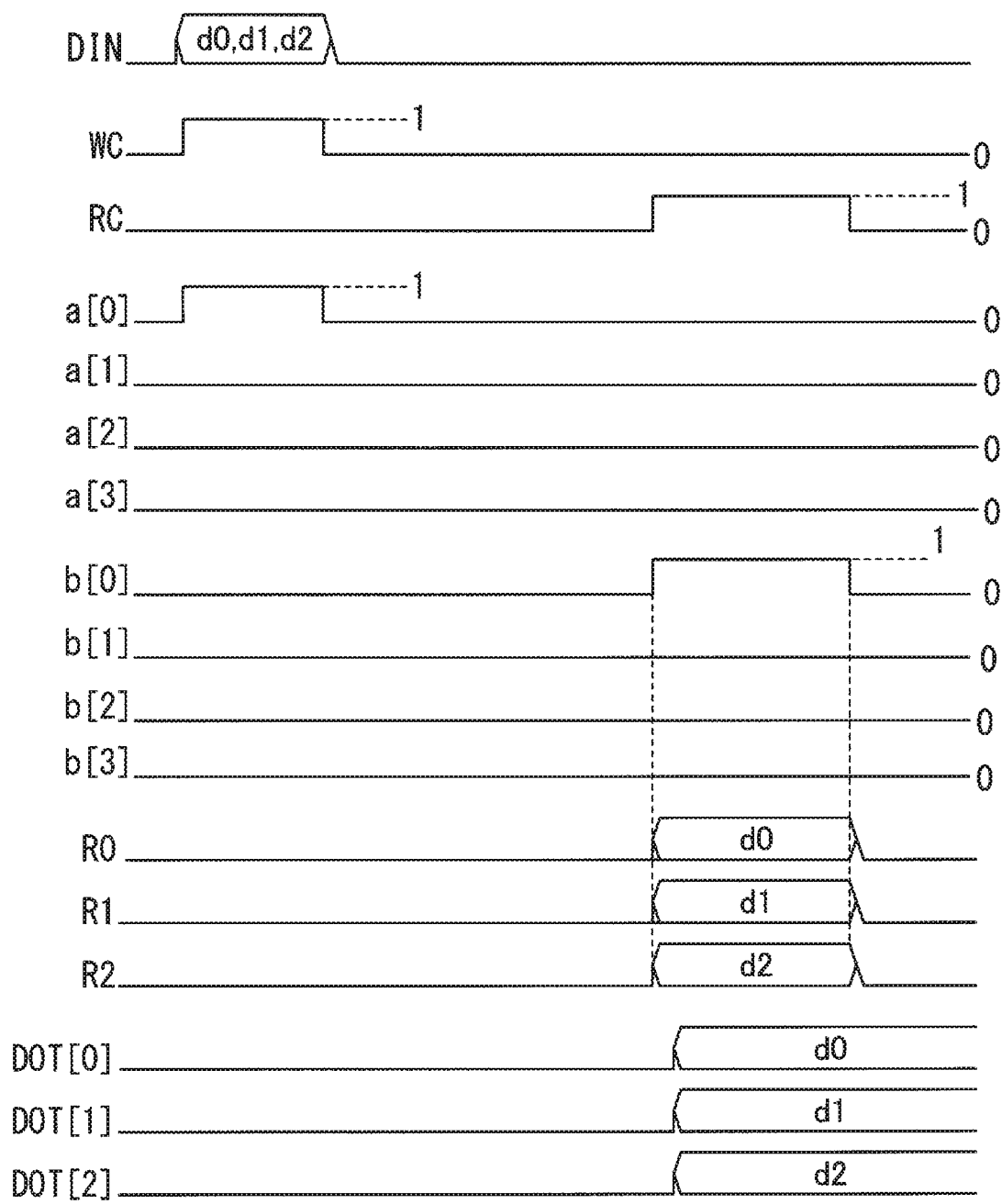
FIG. 3 is a time chart showing an example of the writing and reading operations of information data DIN (d0 to d2) in a normal mode.

FIG. 3 is a time chart showing the operation to write the information data DIN including the bits d0 to d2 into the memory cells MC0, MC4, and MC8 corresponding to the address [0000] indicated by the address AD, and the operation to read the information data DIN from those memory cells.

The data conversion unit DCV generates the 0th to second write-in voltages corresponding to the logic levels of the bits d0 to d2 of the information data DIN, and supplies the respective voltages to the memory access blocks BK0 to BK2 via the data bit lines D0 to D2. The address control unit ACN supplies, to the selector 30 of each memory access block BK0 to BK2, the bit line selection signal a[3:0] in which the logic level of the bit line selection signal a[0] is set to 1, and the logic level of a[1] to a[2] is set to 0 based on the address SA.

This way, the bit d0 of the information data DIN is written in the memory cell MC0, the bit d1 is written in the memory cell MC4, and the bit d2 is written in the memory cell MC8.

Thereafter, in accordance with the read-out command signal RC of the logic level 1, the address control unit ACN supplies, to the selector 60 of each memory access block BK0 to BK2, the bit line selection signal b[3:0] in which the logic level of the bit line selection signal b[0] is set to 1, and the logic level of b[1] to b[3] is set to 0 based on the address SB.

This way, the data bit R0 representing the bit d0 is read out from the memory cell MC0, and this data bit R0 is output as the read-out data DOT[0]. The data bit R1 representing the bit d1 is read out from the memory cell MC4, and this data bit R0 is output as the read-out data DOT[1]. Furthermore, the data bit R2 representing the bit d2 is read out from the memory cell MC8, and this data bit R0 is output as the read-out data DOT[2].

As described above, in the normal mode, the bits d0 to d2 in the information data DIN are written in the three memory cells (MC0, MC4, and MC11) corresponding to the address [0000], respectively, via the data bit lines D0 to D2, in accordance with the write-in command signal WC. Those bits d0 to d2 are read out from the three memory cells in accordance with the read-out command signal RC, and output as the read-out data DOT[0] to DOT[2], respectively.

Thus, in the normal mode, the data input/output unit 105 outputs the read-out data DOT [20:0] including the read-out data DOT[0] to DOT [2] as the official read-out data.

[Majority Voting Mode]

Figure 4:
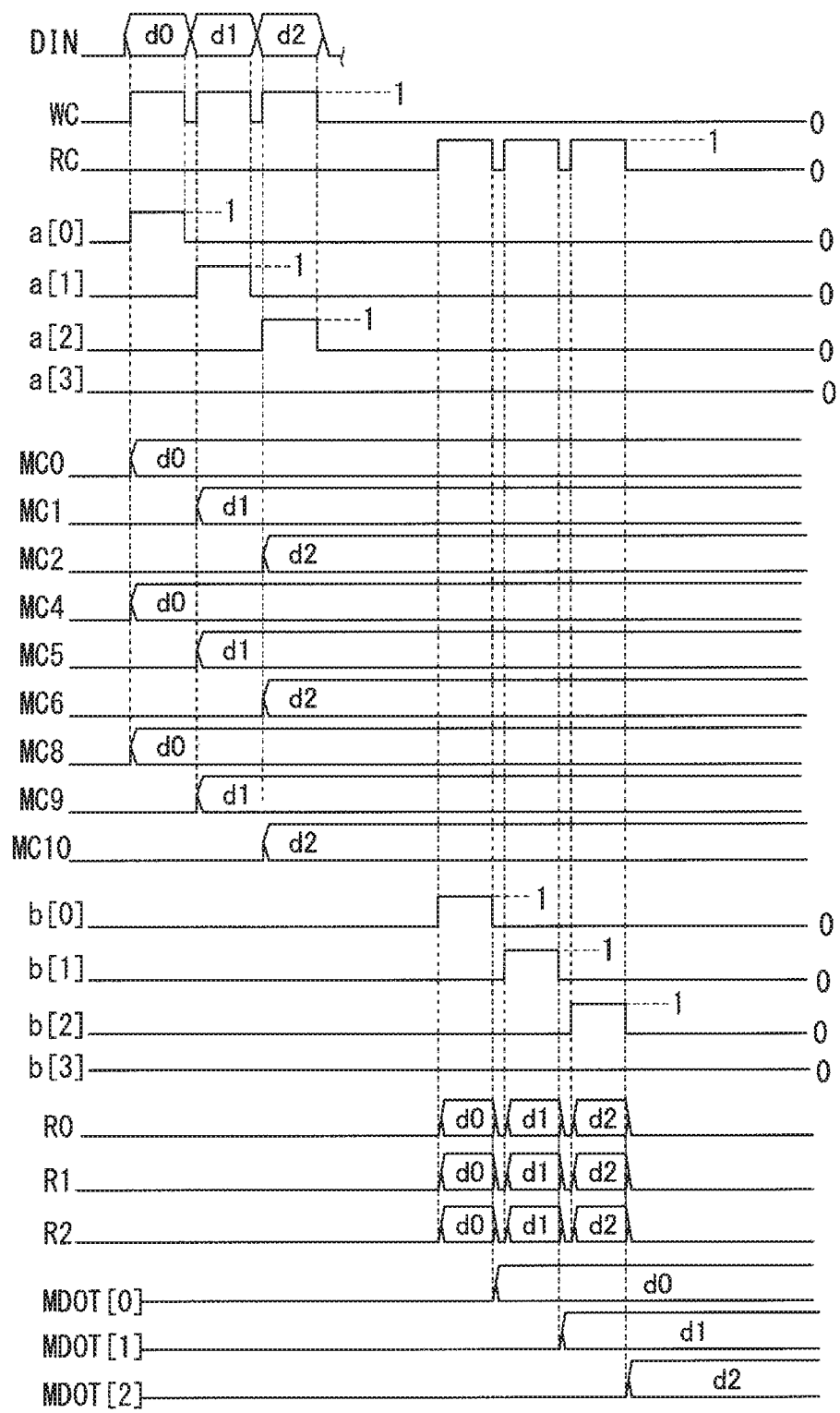
FIG. 4 is a time chart showing an example of the writing and reading operations of information data DIN (d0 to d2) in a majority voting mode.

FIG. 4 is a time chart showing the operation to write the information data DIN including the bits d0 to d2 into the memory cell group connected to the word line W0, and the operation to read the information data DIN from the memory cell group when the operation mode signal MOD indicates the majority voting mode.

First, as shown in FIG. 4, the control unit 102 supplies the write-in command signal WC having the successive pulse strings of the logic level 1 to the address control unit ACN and the data conversion unit DCV.

The data conversion unit DCV takes in the information data DIN including the bits d0 to d2, one bit at a time, at the same timing as the timing of each pulse of the write-in command signal WC as shown in FIG. 4.

First, the data conversion unit DCV generates the 0th write-in voltage corresponding to the logic level of the bit d0 of the information data DIN, and supplies the voltage to the respective memory access blocks BK0 to BK2 via the data bit lines D0 to D2 at the same time. Thereafter, in accordance with the first part with the logic level 1 of the write-in command signal WC, the address control unit ACN supplies, to the selector 30 of each memory access block BK0 to BK2, the bit line selection signal a[3:0] in which the logic level of the bit line selection signal a[0], which corresponds to the address [0000], is set to 1, and the logic level of a[1] to a[3] is set to 0 as shown in FIG. 4.

This way, the bit d0 of the information data DIN is written in the memory cells MC0, MC4, and MC8 corresponding to the address [0000].

Next, the data conversion unit DCV generates the first write-in voltage corresponding to the logic level of the bit d1 of the information data DIN, and supplies the voltage to the respective memory access blocks BK0 to BK2 via the data bit lines D0 to D2 at the same time. Thereafter, in accordance with the second part with the logic level 1 of the write-in command signal WC, the address control unit ACN supplies, to the selector 30 of each memory access block BK0 to BK2, the bit line selection signal a[3:0] in which the logic level of the bit line selection signal a[1], which corresponds to the address [0001], is set to 1, and the logic level of a[0], a[2], and a[3] are set to 0 as shown in FIG. 4.

This way, the bit d1 of the information data DIN is written in the memory cells MC1, MC5, and MC9 corresponding to the address [0001].

Next, the data conversion unit DCV generates the second write-in voltage corresponding to the logic level of the bit d2 of the information data DIN, and supplies the voltage to the respective memory access blocks BK0 to BK2 via the data bit lines D0 to D2 at the same time. Thereafter, in accordance with the third part with the logic level 1 of the write-in command signal WC, the address control unit ACN supplies, to the selector 30 of each memory access block BK0 to BK2, the bit line selection signal a[3:0] in which the logic level of the bit line selection signal a[2], which corresponds to the address [0002], is set to 1, and the logic level of a[0], a[1], and a[3] is set to 0 as shown in FIG. 4.

This way, the bit d2 of the information data DIN is written in the memory cells MC2, MC6, and MC10 corresponding to the address [0002].

Thereafter, as shown in FIG. 4, the control unit 102 supplies the read-out command signal RC having the successive pulse strings of the logic level 1 to the address control unit ACN and the data conversion unit DCV.

In accordance with the first part with the logic level 1 of the read-out command signal RC, the address control unit ACN supplies, to the selector 60 of each memory access block BK0 to BK2, the bit line selection signal b[3:0] in which the logic level of the bit line selection signal b[0], which corresponds to the address [0000], is set to 1, and the logic level of b[1] to b[3] is set to 0 as shown in FIG. 4.

This way, the data bits R0, R1, and R2, which all represent the bit d0, are read out from the respective memory cells MC0, MC4, and MC8 that correspond to the address [0000]. The majority voting calculation circuit 20 of the majority voter MV performs majority voting on the logic levels of the data bits R0, R1, and R2, and supplies the result to the latches 10a to 10c as the data bit RD representing the bit d0. In this case, only the latch 10a, of the latches 10a to 10c, takes in the data bit RD representing the bit d0 in accordance with the bit line selection signal b[0] of the logic level 1, and outputs this data as the read-out data MDOT[0] representing the 0th bit of the read-out data.

Next, in accordance with the second part with the logic level 1 of the read-out command signal RC, the address control unit ACN supplies, to the selector 60 of each memory access block BK0 to BK2, the bit line selection signal b[3:0] in which the logic level of the bit line selection signal b[1], which corresponds to the address [0001], is set to 1, and the logic level of b[0], b[2], and b[3] are set to 0 as shown in FIG. 4.

This way, the data bits R0, R1, and R2, which all represent the bit d1, are read out from the respective memory cells MC1, MC5, and MC9 that correspond to the address [0001]. The majority voting calculation circuit 20 performs majority voting on the logic levels of the data bits R0, R1, and R2, and supplies the result to the latches 10a to 10c as the data bit RD representing the bit d1. In this case, only the latch 10b, of the latches 10a to 10c, takes in the data bit RD representing the bit d1 in accordance with the bit line selection signal b[1] of the logic level 1, and outputs this data as the read-out data MDOT[1] representing the first bit of the read-out data.

Next, in accordance with the third part with the logic level 1 of the read-out command signal RC, the address control unit ACN supplies, to the selector 60 of each memory access block BK0 to BK2, the bit line selection signal b[3:0] in which the logic level of the bit line selection signal b[2], which corresponds to the address [0002], is set to 1, and the logic level of b[0], b[1], and b[3] is set to 0 as shown in FIG. 4.

This way, the data bits R0, R1, and R2, which all represent the bit d2, are read out from the respective memory cells MC2, MC6, and MC10 that correspond to the address [0002]. The majority voting calculation circuit 20 performs majority voting on the logic levels of the data bits R0, R1, and R2, and supplies the result to the latches 10a to 10c as the data bit RD representing the bit d2. In this case, only the latch 10c, of the latches 10a to 10c, takes in the data bit RD representing the bit d2 in accordance with the bit line selection signal b[2] of the logic level 1, and outputs this data as the read-out data MDOT[2] representing the second bit of the read-out data.

That is, in the majority voting mode, the read-out data MDOT[20:0] including the read-out data MDOT[0] to MDOT[2] described above is output as the official read-out data.

In the configuration illustrated in FIG. 2 where the memory cell array 101 including a plurality of storage element groups each made up of 21 memory cells MC that correspond to 21 bits, respectively, and each corresponding to one address (AD) is used, the majority voting process is performed on information data pieces as follows.

First, for every bit of the information data DIN, that one bit is written into three memory cells MC corresponding to one address. Then, those three bits written in the three memory cells MC corresponding to one address is read out as the data bits R0 to R2, and the majority voting is performed on the read-out three data bits R0 to R2.

This way, the respective bits of three pieces of information data to be subjected to the majority voting are read out at the same time for the same bit digit through one access to the single memory cell array 101. Thus, the majority voting calculation circuit 20 can directly perform the majority voting on the read-out three bits.

This makes it possible to eliminate the need to provide data latches in a stage preceding the majority voting calculation circuit 20, which is required when the information data pieces that are subjected to the majority voting are written in k-number of different addresses, and those information data pieces are read out successively from the respective addresses through k-number of accesses. As a result, with the configuration illustrated in FIG. 2, it is possible to perform majority voting on the information data pieces without increasing the device size.

Embodiment 2

Figure 5:
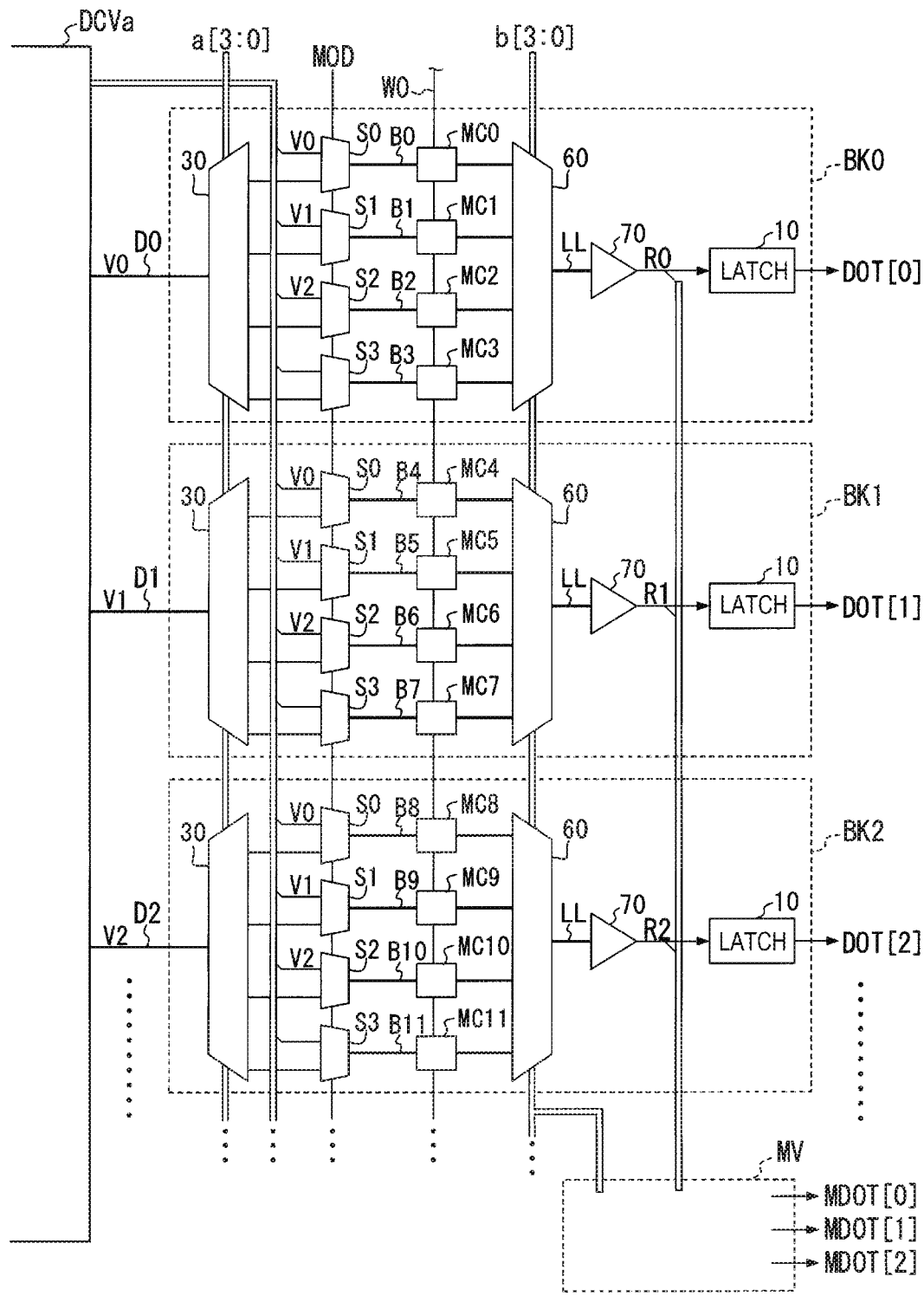
FIG. 5 is a block diagram showing another example of the internal configuration of the column decoder 104 and the data input/output unit 105.

FIG. 5 is a block diagram showing another example of the internal configuration of the column decoder 104 and the data input/output unit 105.

The configuration of FIG. 5 is the same as that of FIG. 2 except that the data conversion unit DCV is replaced with a data conversion unit DCVa, and dual-input selectors S0 to S3 are additionally provided in each memory access block BK. FIG. 5 does not show the internal configuration of the majority voter MV or the address control unit ACN.

Below, the configuration illustrated in FIG. 5 will be explained, mainly focusing on the data conversion unit DCVa and the dual-input selectors S0 to S3.

When the data conversion unit DCVa receives the information data DIN made up of the 0th to 20th bits, the data conversion unit DCVa generates the 0th to 20th write-in voltages V0 to V20 each having a voltage value corresponding to the logic level of each of the 0th to 20th bits.

When the operation mode signal MOD indicates the normal mode, the data conversion unit DCVa supplies the generated write-in voltages V0 to V20 to the corresponding memory access blocks BK via the data bit lines D0 to D20, respectively.

On the other hand, when the operation mode signal MOD indicates the majority voting mode, the data conversion unit DCVa divides the write-in voltages V0 to V20 into write-in voltage groups each including three write-in voltages, and supplies each write-in voltage group to three memory cell blocks BK. For example, the data conversion unit DCVa supplies the write-in voltage group including the write-in voltages V0 to V2, out of the write-in voltages V0 to V20, respectively to the three memory cell blocks BK0 to BK2 illustrated in FIG. 5.

The respective dual-input selectors S0 to S3 in each memory cell block BK are supplied with the operation mode signal MOD. The duel-input selectors S0 to S3 are respectively connected to the corresponding bit lines B. Furthermore, out of the two input terminals of each of the dual-input selectors S0 to S3, one input terminal is applied with one write-in voltage included in the write-in voltage group, and the other input terminal is connected to the selector 30.

When the operation mode signal MOD indicates the normal mode, each of the dual-input selectors S0 to S3 connects the bit line B connected thereto and the selector 30. This makes each memory cell block BK illustrated in FIG. 5 have the circuit configuration equivalent to each memory cell block illustrated in FIG. 2.

On the other hand, when the operation mode signal MOD indicates the majority voting mode, each of the dual-input selectors S0 to S3 applies the received write-in voltage to the corresponding memory cell MC via the corresponding bit line B connected thereto, without going through the selector 30. As a result, different write-in voltages are applied to the plurality of memory cells MC provided for the respective bits of the information data DIN at the same time.

Figure 6:
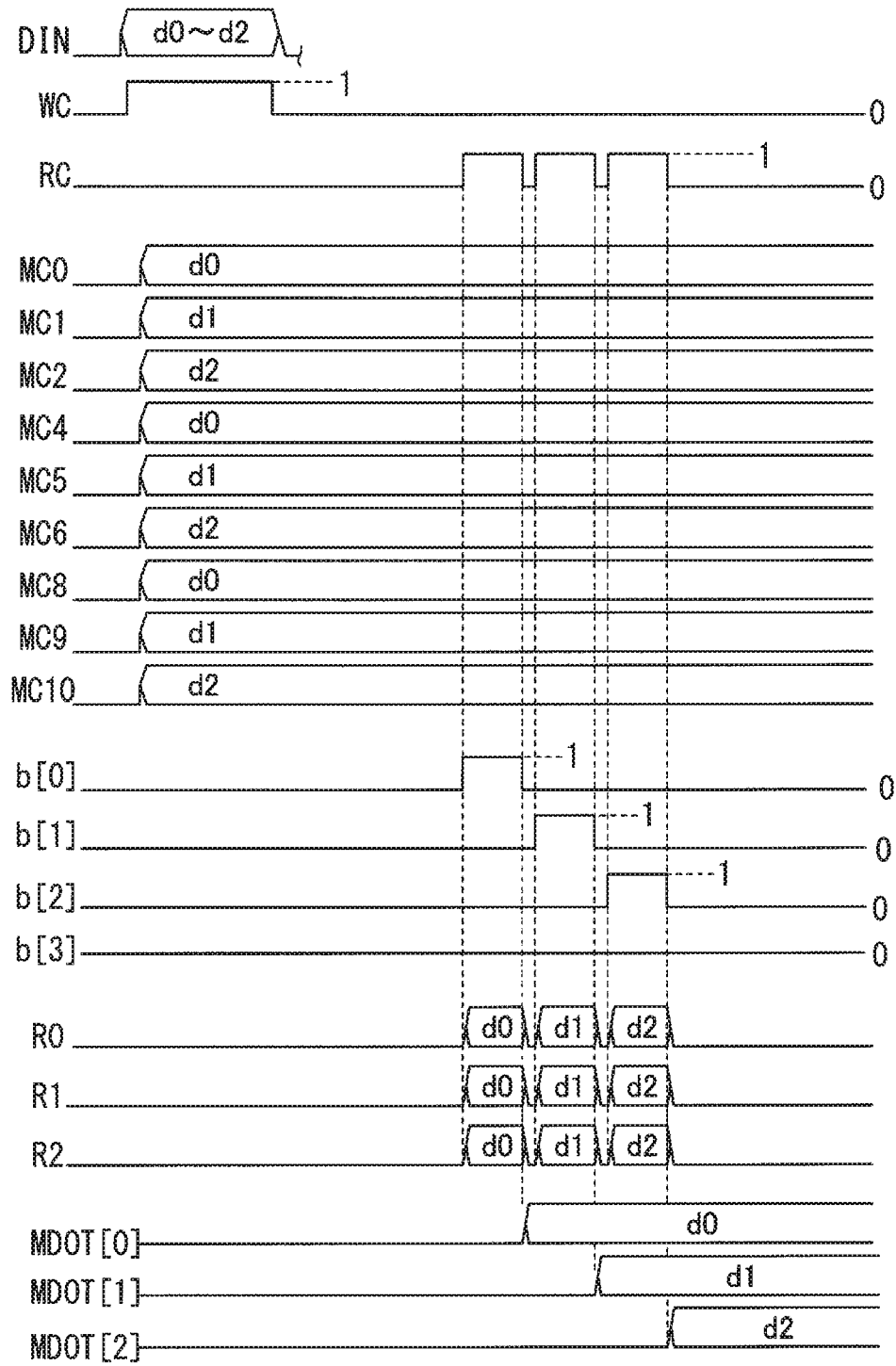
FIG. 6 is a time chart showing another example of the writing and reading operations of information data DIN (d0 to d2) in a majority voting mode.

FIG. 6 is a time chart showing the operation to write the information data DIN including the bits d0 to d2 into the memory cell group connected to the word line W0, and the operation to read the information data DIN from the memory cell group in the majority voting mode.

First, as shown in FIG. 6, the control unit 102 supplies the write-in command signal WC of the logic level 1 to the address control unit ACN and the data conversion unit DCVa.

In accordance with the write-in command signal WC, the data conversion unit DCVa supplies the write-in voltages V0 to V2 corresponding to the bits d0 to d2 of the information data DIN to the memory cell blocks BK0 to BK2, respectively.

The dual-input selectors S0 to S2 of the memory cell block BK0 apply the write-in voltages V0 to V2 to the memory cells MC0 to MC2 via the bit lines B0 to B2. This way, as illustrated in FIG. 6, the bit d0 of the information data DIN is written in the memory cell MC0, the bit d1 is written in the memory cell MC1, and the bit d2 is written in the memory cell MC2.

The dual-input selectors S0 to S2 of the memory cell block BK1 apply the write-in voltages V0 to V2 to the memory cells MC4 to MC6 via the bit lines B4 to B6. This way, as illustrated in FIG. 6, the bit d0 of the information data DIN is written in the memory cell MC4, the bit d1 is written in the memory cell MC5, and the bit d2 is written in the memory cell MC6.

The dual-input selectors S0 to S2 of the memory cell block BK2 apply the write-in voltages V0 to V2 to the memory cells MC8 to MC10 via the bit lines B8 to B10. This way, as illustrated in FIG. 6, the bit d0 of the information data DIN is written in the memory cell MC8, the bit d1 is written in the memory cell M9, and the bit d2 is written in the memory cell MC10.

Thereafter, as shown in FIG. 6, the control unit 102 supplies the read-out command signal RC having the successive pulse strings of the logic level 1 to the address control unit ACN and the data conversion unit DCVa.

In accordance with the first part with the logic level 1 of the read-out command signal RC, the address control unit ACN supplies, to the selector 60 of each memory access block BK0 to BK2, the bit line selection signal b[3:0] in which the logic level of the bit line selection signal b[0], which corresponds to the address [0000], is set to 1, and the logic level of b[1] to b[3] are set to 0 as shown in FIG. 6.

This way, the data bits R0, R1, and R2, which all represent the bit d0, are read out from the respective memory cells MC0, MC4, and MC8 that correspond to the address [0000] as illustrated in FIG. 6. The majority voting calculation circuit 20 of the majority voter MV performs majority voting on the logic levels of the data bits R0 to R2, and supplies the result to the latches 10a to 10c as the data bit RD representing the bit d0. In this case, only the latch 10a, of the latches 10a to 10c, takes in the data bit RD representing the bit d0 in accordance with the bit line selection signal b[0] of the logic level 1, and outputs this data as the read-out data MDOT[0] representing the 0th bit of the read-out data.

Next, in accordance with the second part with the logic level 1 of the read-out command signal RC, the address control unit ACN supplies, to the selector 60 of each memory access block BK0 to BK2, the bit line selection signal b[3:0] in which the logic level of the bit line selection signal b[1], which corresponds to the address [0001], is set to 1, and the logic level of b[0], b[2], and b[3] is set to 0 as shown in FIG. 6.

This way, the data bits R0, R1, and R2, which all represent the bit d1, are read out from the respective memory cells MC1, MC5, and MC9 that correspond to the address [0001] as illustrated in FIG. 6. The majority voting calculation circuit 20 performs majority voting on the logic levels of the data bits R0, R1, and R2, and supplies the result to the latches 10a to 10c as the data bit RD representing the bit d1. In this case, only the latch 10b, of the latches 10a to 10c, takes in the data bit RD representing the bit d1 in accordance with the bit line selection signal b[1] of the logic level 1, and outputs this data as the read-out data MDOT[1] representing the first bit of the read-out data.

Next, in accordance with the third part with the logic level 1 of the read-out command signal RC, the address control unit ACN supplies, to the selector 60 of each memory access block BK0 to BK2, the bit line selection signal b[3:0] in which the logic level of the bit line selection signal b[2], which corresponds to the address [0002], is set to 1, and the logic level of b[0], b[1], and b[3] is set to 0 as shown in FIG. 6.

This way, the data bits R0, R1, and R2, which all represent the bit d2, are read out from the respective memory cells MC2, MC6, and MC10 that correspond to the address [0002] as illustrated in FIG. 6. The majority voting calculation circuit 20 performs majority voting on the logic levels of the data bits R0, R1, and R2, and supplies the result to the latches 10a to 10c as the data bit RD representing the bit d2. In this case, only the latch 10c, of the latches 10a to 10c, takes in the data bit RD representing the bit d2 in accordance with the bit line selection signal b[2] of the logic level 1, and outputs this data as the read-out data MDOT[2] representing the second bit of the read-out data.

With the configuration of FIG. 5, in a manner similar to the configuration of FIG. 2, the respective bits of the three read-out data pieces that are subjected to the majority voting can be read out, as the data bits R0 to R2, by one read-out access at the same time for the same bit digit in the majority voting mode. This eliminates the need to provide three data latches, which are configured to hold respective read-out data pieces until all three read-out data pieces are obtained, in the stage preceding to the majority voting calculation circuit 20 that performs majority voting.

As a result, with the configuration of FIG. 5 as well, the overall size of the device can be reduced as in the configuration of FIG. 2.

Furthermore, with the configuration of FIG. 5, when the information data DIN is to be written in the majority voting mode, the respective bits of the information data can be written in the memory cell array 101 at the same time in a manner similar to the data writing in the normal mode. Thus, the data can be written more rapidly and easily as compared to the case in which the respective bits of the information data DIN are written in a certain order in the time-division manner as in FIG. 4.

In the respective embodiments described above, the bit number of the information data DIN that is subjected to the majority voting was 21 bits, but it is not limited thereto. The majority voting calculation circuit 20 performs majority voting on the three data bits R0 to R2, but the majority voting may be performed on any odd-number data bits equal to or greater than 3 according to embodiments.

That is, the majority voting processing device of one embodiment a memory (such as a solid-state memory device or memory portion of a semiconductor chip), a memory access unit, and a majority voter as described above to perform majority voting on the respective bits of the information data piece made up of r-number of bits (r is an integer of 2 or greater).

The memory (101) includes a plurality of memory element groups each made up of r-number of memory elements that store data for the corresponding r-number of bits, respectively, the plurality of memory element groups each being provided for one address. The memory access unit (BK0 to BK20, ACN, and DCV) writes each bit of the information data piece (DIN) in k-number (k is an odd number of 3 or greater) of memory elements in the memory element group corresponding to one address, and reads out the k-number of bits written in the k-number of memory elements corresponding to one address. The majority voter (MV) performs majority voting on the k-number of bits read out from the memory by the memory access unit.

What is claimed is:

1. A majority voting processing device performing majority voting on respective bits of an information data piece including r-number of bits (where r is an integer of 2 or greater), comprising:
   a memory including a plurality of memory element groups each including r-number of memory elements that store data for a corresponding r-number of bits, respectively, each of the plurality of memory element groups corresponding to a separate address;
   a memory access unit that writes each bit of the information data piece in k-number (where k is an odd number of 3 or greater) of the memory elements in the memory element groups, the k-number of the memory elements corresponding to a same address, and reads out the k-number of bits written in the k-number of the memory elements corresponding to said same address; and a majority voter that receives as inputs the k-number of bits and performs majority voting on the k-number of bits read out from the memory by the memory access unit to generate read-out data;

wherein the memory includes a plurality of bit lines connected to the memory elements, wherein the memory access unit receives an operation mode signal indicating a normal mode or a majority voting mode, and wherein the memory access unit includes:
  a data conversion unit that generates r-number of write-in voltages corresponding to the respective bits of the information data piece and that applies the write-in voltages to r-number of data bit lines, respectively;
  a first selector that selects r-number of bit lines from the plurality of bit lines in accordance with the address and that connects the selected bit lines to the r-number of data bit lines; and
  a second selector that electrically connects the first selector to respective bit lines when the operation mode signal indicates the normal mode, the second selector applying the r-number of write-in voltages to the plurality of bit lines, respectively, when the operation mode signal indicates the majority voting mode.

2. The majority voting processing device according to claim 1,
  wherein the memory access unit includes an address control unit that changes the address after a certain time period has passed when a read-out operation is performed on the memory, and
  wherein the majority voter includes a majority voting calculation circuit that performs majority voting on the k-number of bits and obtains a majority voting result of one bit, and a plurality of latches that separately hold the majority voting result of the one bit obtained by the majority voting calculation circuit for each address, and output said result as a majority voting result of the information data segment.

3. The majority voting processing device according to claim 1,
  wherein, when the operation mode signal indicates the majority voting mode, the memory access unit writes each bit of the information data piece in the k-number of the memory elements in the memory element group corresponding to the same address, and reads out the k-number of bits written in the k-number of the memory elements corresponding to said same address at a same time, and
  wherein, when the operation mode signal indicates the normal mode, the memory access unit writes each of the r-number of bits of the information data piece in the memory element group corresponding to the same address, and reads out each of the r-number of bits written in the memory element group corresponding to said same address.

4. A semiconductor storage device, comprising:
  a memory cell array including a plurality of memory element groups each including r-number (where r is an integer of 2 or greater) of memory cells that store data for respective r-number of bits, each of the plurality of memory element groups being provided for a separate address;
  a memory access unit that writes each bit of an information data piece in k-number (where k is an odd number of 3 or greater) of said memory cells in the memory element groups, the k-number of said memory cells corresponding to a same address, and reads out the k-number of bits written in the k-number of said memory cells corresponding to said same address; and
  a majority voter that performs majority voting on the k-number of bits read out from the memory cell array by the memory access unit;
  wherein the memory cell array includes a plurality of bit lines connected to the memory elements,
  wherein the memory access unit receives an operation mode signal indicating a normal mode or a majority voting mode, and
  wherein the memory access unit includes:
    a data conversion unit that generates r-number of write-in voltages corresponding to respective bits of the information data piece and that applies the write-in voltages to r-number of data bit lines, respectively;
    a first selector that selects r-number of bit lines from the plurality of bit lines in accordance with the address and that connects the selected bit lines to the r-number of data bit lines; and
    a second selector that electrically connects the first selector to respective bit lines when the operation mode signal indicates the normal mode, the second selector applying the r-number of write-in voltages to the plurality of bit lines, respectively, when the operation mode signal indicates the majority voting mode.

5. A majority voting method of information data in which an information data piece of r-number of bits (where r is an integer of 2 or greater) is written in k-number of places (where k is an odd number of 3 or greater) in a memory that includes a plurality of memory element groups each including r-number of memory elements that store data for respective r-number of bits, each of the plurality of memory element groups being provided for a separate address, and majority voting is performed on respective bits of a same bit digit of the k-number of information data pieces read out from the k-number of places for each bit digit, the method comprising:
  writing, for each bit of the information data piece, the bit into k-number of memory elements corresponding to a same address; and
  reading out the k-number of bits written in the k-number of memory elements corresponding to the same address at a same time, and performing majority voting on the k-number of bits that are read out from the k-number of memory elements;
  wherein the memory includes a plurality of bit lines connected to the memory elements, and
  wherein the method further comprises:
    receiving an operation mode signal indicating a normal mode or a majority voting mode;
    generating r-number of write-in voltages corresponding to respective bits of the k-number of information data pieces and applying the write-in voltages to r-number of data bit lines, respectively;
    by a first selector, selecting r-number of bit lines from the plurality of bit lines in accordance with the address and connecting the selected bit lines to the r-number of data bit lines; and by a second selector, electrically connecting the first selector to respective bit lines when the operation mode signal indicates the normal mode and applying the r-number of write-in voltages to the plurality of bit lines, respectively, when the operation mode signal indicates the majority voting mode.

\* \* \* \* \*